United States Patent
McGuire (10) Patent No.: US 9,000,988 B2
(45) Date of Patent: *Apr. 7, 2015

(54) WIRELESS FIELD DEVICE WITH RUGGED ANTENNA AND ROTATION STOP

(71) Applicant: Rosemount Inc., Chanhassen, MN (US)

(72) Inventor: Chad M McGuire, Minneapolis, MN (US)

(73) Assignee: Rosemount Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/751,712

(22) Filed: Jan. 28, 2013

(65) Prior Publication Data

US 2013/0141286 A1 Jun. 6, 2013

Related U.S. Application Data

(63) Continuation of application No. 12/250,040, filed on Oct. 13, 2008, now Pat. No. 8,362,959.

(51) Int. Cl.
*H01Q 1/24* (2006.01)
*H01Q 3/02* (2006.01)
*H01Q 3/06* (2006.01)
*H05K 7/14* (2006.01)

(52) U.S. Cl.
CPC . *H01Q 1/24* (2013.01); *H01Q 3/06* (2013.01); *H05K 7/1462* (2013.01)

(58) Field of Classification Search
USPC .................................. 343/702, 882, 700 MS
See application file for complete search history.

(56) References Cited

U.S. PATENT DOCUMENTS

| | | | |
|---|---|---|---|
| 4,435,713 A | | 3/1984 | Gasparaitis et al. |
| 5,032,846 A | * | 7/1991 | Chang ........................... 343/882 |
| 5,049,896 A | | 9/1991 | Conley |
| 5,168,278 A | * | 12/1992 | Morita .......................... 343/702 |
| 5,392,056 A | | 2/1995 | DeTeso |
| 5,403,197 A | | 4/1995 | Ernst et al. |
| 5,440,315 A | | 8/1995 | Wright et al. |
| 5,734,716 A | | 3/1998 | Kulberg |

(Continued)

FOREIGN PATENT DOCUMENTS

| WO | 9726685 | 7/1997 |
|---|---|---|
| WO | 0008707 | 2/2000 |

(Continued)

OTHER PUBLICATIONS

International Search Report and Written Opinion for Appln. No. PCT/US2009/052562, dated Feb. 16, 2010.

(Continued)

*Primary Examiner* — Trinh Dinh
(74) *Attorney, Agent, or Firm* — Westman Champlin & Koehler, P.A.

(57) ABSTRACT

A field device includes a housing having at least an antenna receiving bore. Field device electronics are disposed within the housing and include wireless communication circuitry configured to communicate wireless process information. An antenna assembly includes an antenna base engaged within the antenna receiving bore of the housing. The antenna assembly including an antenna operably coupled to the wireless communication circuitry. The antenna assembly is rotatable within the bore by an amount less than one full rotation, and rotation of the antenna assembly varies orientation of the antenna.

22 Claims, 6 Drawing Sheets

(56) References Cited

U.S. PATENT DOCUMENTS

| | | | |
|---|---|---|---|
| 5,781,867 A * | 7/1998 | Tidwell | 455/575.7 |
| 5,805,115 A | 9/1998 | Pellerin et al. | |
| 5,828,341 A * | 10/1998 | Delamater | 343/702 |
| 5,907,306 A | 5/1999 | Karabinis et al. | |
| 5,936,581 A * | 8/1999 | Roshitsh et al. | 343/702 |
| 5,949,379 A | 9/1999 | Yang | |
| 6,005,523 A | 12/1999 | Rudisill | |
| 6,052,090 A | 4/2000 | Simmons et al. | |
| 6,166,707 A | 12/2000 | Painter et al. | |
| 6,219,007 B1 * | 4/2001 | Kline et al. | 343/895 |
| 6,275,198 B1 | 8/2001 | Kenoun et al. | |
| 6,337,671 B1 | 1/2002 | Lee | |
| 6,518,928 B1 * | 2/2003 | Sheu | 343/702 |
| 6,710,747 B1 | 3/2004 | Chang | |
| 7,046,212 B2 * | 5/2006 | Tai et al. | 343/882 |
| 7,190,053 B2 | 3/2007 | Orth et al. | |
| 7,196,671 B2 | 3/2007 | Chen et al. | |
| 7,787,921 B2 | 8/2010 | Gansen | |
| 7,957,708 B2 * | 6/2011 | Karschnia et al. | 455/127.1 |
| 8,362,959 B2 | 1/2013 | McGuire | |
| 2003/0171827 A1 | 9/2003 | Keyes, IV et al. | |
| 2003/0184494 A1 | 10/2003 | Yagi | |
| 2005/0110684 A1 | 5/2005 | Liu | |
| 2005/0208908 A1 | 9/2005 | Karschnia et al. | |
| 2006/0069208 A1 | 3/2006 | Dhawan et al. | |
| 2006/0079188 A1 | 4/2006 | Chintala | |
| 2007/0198224 A1 | 8/2007 | McGuire | |
| 2008/0079641 A1 | 4/2008 | Grunig et al. | |

FOREIGN PATENT DOCUMENTS

| | | |
|---|---|---|
| WO | 2004070878 | 8/2004 |
| WO | 2008042249 | 4/2008 |

OTHER PUBLICATIONS

Material Data Sheet for Valox Resin 3706, SABIC Innovative Plastics, 2007.

Material data sheet for GE Plastics VALOX 3706 PBT, http://mymatweb.com/search/SpecificMaterialPrint.asp?bassnum=PGE8NA555, 2007.

Invitation to Pay Additional Fees and Communication Relating to the Results of the Partial International Search, PCT/US2007/004353, filed Feb. 20, 2007.

Notification of Receipt of Search Copy, PCT/US2007/004353, filed Feb. 20, 2007, 3 pgs.

International Search Report & Written Opinion for appln. No. PCT/US2007/004353, filed Feb. 20, 2007; mailed Sep. 27, 2007.

Communication in European Patent Appln. No. 07751135.0-220, mailed Dec. 29, 2009, 4 pgs.

Wireless Base Radio XYR 5000: Product Specification and Model Selection Guide, Honeywell International Inc., Dec. 2004, 5 pgs.

International Search Report and Written Opinion for Appln. No. PCT/US2007/020913, filed Sep. 9, 2007.

Material data sheet for Valox Resin V3900 WX, SABIC Innovative Plastics, 2007.

Second Office Action (Notification of Reasons for Rejection) dated Oct. 8, 2013 in related Japanese patent appln. serial No. 2011-531043. 4 pgs. including English Translation.

US Office Action from corresponding U.S. Appl. No. 12/250,040, dated Apr. 25, 2012.

US Office Action from corresponding U.S. Appl. No. 12/250,040, dated Feb. 14, 2012.

US Office Action from corresponding U.S. Appl. No. 12/250,040, dated Jun. 24, 2011.

* cited by examiner

WIRELESS FIELD DEVICE WITH RUGGED ANTENNA AND ROTATION STOP

BACKGROUND

In industrial settings, control systems are used to monitor and control inventories of industrial and chemical processes, and the like. Typically, the control system performs these functions using field devices distributed at key locations in the industrial process that are coupled to control circuitry in the control room by a process control loop.

Field devices are used by the process control and measurement industry for a variety of purposes. Usually, such devices have a field-hardened enclosure so that they can be installed outdoors in relatively rugged environments and be able to withstand climatological extremes of temperature, humidity, vibration and mechanical shock. Field devices also can typically operate on relatively low power. For example, field devices are currently available that receive all of their operating power from a known 4-20 mA loop.

Some field devices include a transducer. A transducer is understood to mean either a device that generates an electrical output based on a physical input (such as a sensor) or that generates a physical output based on an electrical input signal (such as an actuator). Typically, a transducer transforms an input into an output having a different form. Types of transducers include various analytical equipment, pressure sensors, thermistors, thermocouples, strain gauges, flow transmitters, positioners, actuators, solenoids, indicator lights, and others.

Typically, each field device also includes communication circuitry that is used for communicating with a process control room, or other circuitry, over a process control loop. In some installations, the process control loop is also used to deliver a regulated current and/or voltage to the field device for powering the field device.

Traditionally, analog field devices have been connected to the control room by two-wire process control current loops, with each device being connected to the control room by a single two-wire control loop. Some analog field devices transmit a signal to the control room by modulating the current running through the current loop to a current that is proportional to a sensed process variable. Other analog field devices can perform an action under the control of the control room by controlling the magnitude of the current through the loop. In addition to, or in the alternative, the process control loop can carry digital signals used for communication with field devices. Digital communication allows a much larger degree of communication than analog communication. Moreover, digital field devices do not require separate wiring for each field device. Field devices that communicate digitally can respond to and communicate selectively with the control room and/or other field devices. Further, such devices can provide additional signaling such as diagnostics and/or alarms.

In some installations, wireless technologies have begun to be used to communicate with field devices. Wireless operation simplifies field device wiring and setup. One particular form of wireless communication in industrial locations is known as wireless mesh networking. This is a relatively new communication technology that has proven useful for low cost, battery-powered, wireless communication in commercial measurement applications. Wireless mesh networking is generally a short-range wireless communication system that employs low-power radio-frequency communications and is generally not targeted for long distance, plant-to-plant, pad-to-pad or station-to-station communications.

In general, wireless radio-frequency communication requires the use of an antenna. In such harsh industrial settings, the antenna is a relatively fragile physical component. Moreover, should the antenna break off, communication to the field device itself may be compromised. If the antenna seal to the housing is damaged or degraded (for example by UV exposure or hydrolytic degradation) the environmental seal can fail and cause damage to the field device. Generally, the antenna must extend above the transmitter housing (which is typically metal) and must withstand high vibration levels, impact, and extreme temperatures while maintaining a weather-tight seal and 90° adjustability.

Attempts have been to made provide adjustable antennas where the antenna is allowed to rotate freely when a set screw is loosened. However, it is believed that such unfettered rotation may allow cables within the antenna to twist and become damaged. Known wireless field devices generally employ an omni-directional dipole antenna. In order for two omni-directional dipole antennas to have optimal communication, they must be mounted with the same polarization (orientation). Further, vertical polarity is generally preferred for omni-directional antennas. Accordingly, adjustable antennas for field devices have been provided but it is believed that such adjustable antenna designs do not adequately protect the cabling within the antenna.

Providing an industrial field device having a rugged wireless communication antenna that better protects internal cabling would advance the art of wireless field device communications.

SUMMARY

A field device includes a housing having at least an antenna receiving bore. Field device electronics are disposed within the housing and include wireless communication circuitry configured to communicate wireless process information. An antenna assembly includes an antenna base engaged within the antenna receiving bore of the housing. The antenna assembly including an antenna operably coupled to the wireless communication circuitry. The antenna assembly is rotatable within the bore by an amount less than one full rotation, and rotation of the antenna assembly varies orientation of the antenna.

DETAILED DESCRIPTION OF ILLUSTRATIVE EMBODIMENTS

Figure 1:
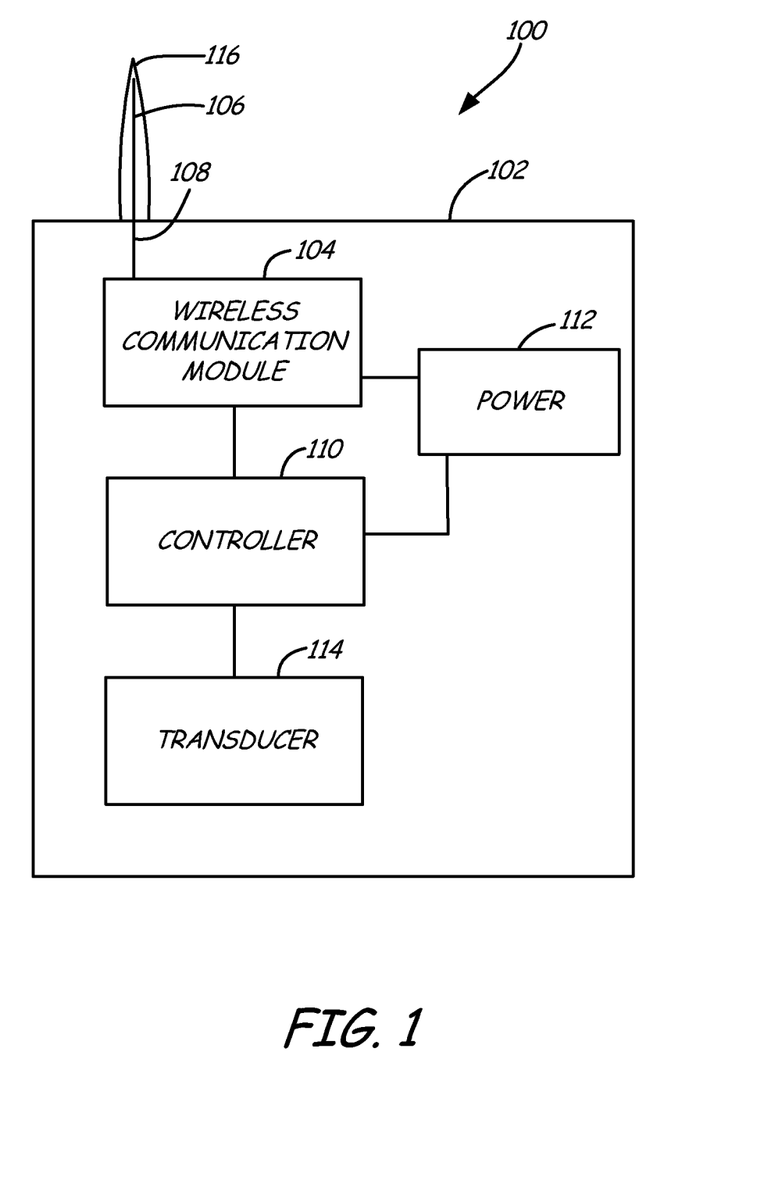
FIG. 1 is a block diagram of a wireless field device in accordance with an embodiment of the present invention.

FIG. 1 is a block diagram of a wireless field device in accordance with an embodiment of the present invention. Wireless field device 100 includes housing 102 illustrated diagrammatically as a rectangular box. However, the rectangular box is not intended to depict the actual shape of the housing 102. Wireless communication module 104 is disposed within housing 102 and is electrically coupled to antenna 106 via connection 108. Antenna 106 can be any suitable arrangement including simply a conductive trace on a printed circuit board. Wireless communication module 104 is also coupled to controller 110 as well as power module 112. Wireless communication module 104 includes any suitable circuitry useful for generating radio frequency signals.

Depending on the application, wireless communication module 104 may be adapted to communicate in accordance with any suitable wireless communication protocol including, but not limited to: wireless networking technologies (such as IEEE 802.15.4 wireless personal area network devices and/or IEEE802.11(b) wireless access points and wireless networking devices built by Linksys of Irvine, Calif.), cellular or digital networking technologies (such as Microburst® by Aeris Communications Inc. of San Jose, Calif.), ultra wide band, global system for mobile communications (GSM), general packet radio services (GPRS), code division multiple access (CDMA), spread spectrum technology, short messaging service/text messaging (SMS), or any other suitable radio frequency wireless technology. Further, known data collision technology can be employed such that multiple field devices employing modules similar to wireless communication module 104 can coexist and operate within wireless operating range of on another. Such collision prevention can include a number of different radio-frequency channels and/or spread spectrum techniques. Additionally, communication module 104 can be a commercially available Bluetooth communication module. In the embodiment illustrated in FIG. 1, wireless communication module 104 is a component within housing 102 that is coupled to antenna 106.

Controller 110 is coupled to wireless communication module 104 and communicates bi-directionally with wireless communication module 104. Controller 110 is any circuit or arrangement that is able to execute one or more instructions to obtain a desired result. Preferably, controller 110 includes a microprocessor, but can also include suitable support circuitry such as onboard memory, communication busses, et cetera.

Each of wireless communication module 104 and controller 110 is coupled to power module 112. Power module 112 may preferably supply all requisite electrical energy for the operation of field device 102 to wireless communication module 104 and controller 110. Power module 112 includes any device that is able to supply stored or generated electricity to wireless communication module 104 and controller 110. Examples of devices that can comprise power module 112 include batteries (rechargeable or otherwise), capacitors, solar arrays, thermoelectric generators, vibration-based generators, wind-based generators, fuel cells, et cetera. Alternatively, power module 112 may be connected to a two-wire process control loop and obtain and store power for use by the wireless communication module. Further, power module 112 could simply be connected to line power receiving, for example, a 24 Volt power supply.

Transducer 114 is coupled to controller 110 and interfaces field device 100 to a physical process. Examples of transducers include sensors, actuators, solenoids, indicator lights, et cetera. Essentially, transducer 114 is any device that is able to transform a signal from controller 110 into a physical manifestation, such as a valve movement, or any device that generates an electrical signal to controller 110 based upon a real-world condition, such as a process fluid pressure.

Embodiments of the present invention generally provide an industrial antenna mounting configuration that seals a field device housing from the environment and allows the antenna to be adjusted achieving vertical polarity in all possible field device orientations. Embodiments of the present invention also provide a rotation stop for the antenna to prevent the antenna from being rotated more than a full rotation, and preferably less than approximately 300°. This prevents twisting of the cabling that runs within from antenna 106 to wireless communication module 104.

Figure 2:
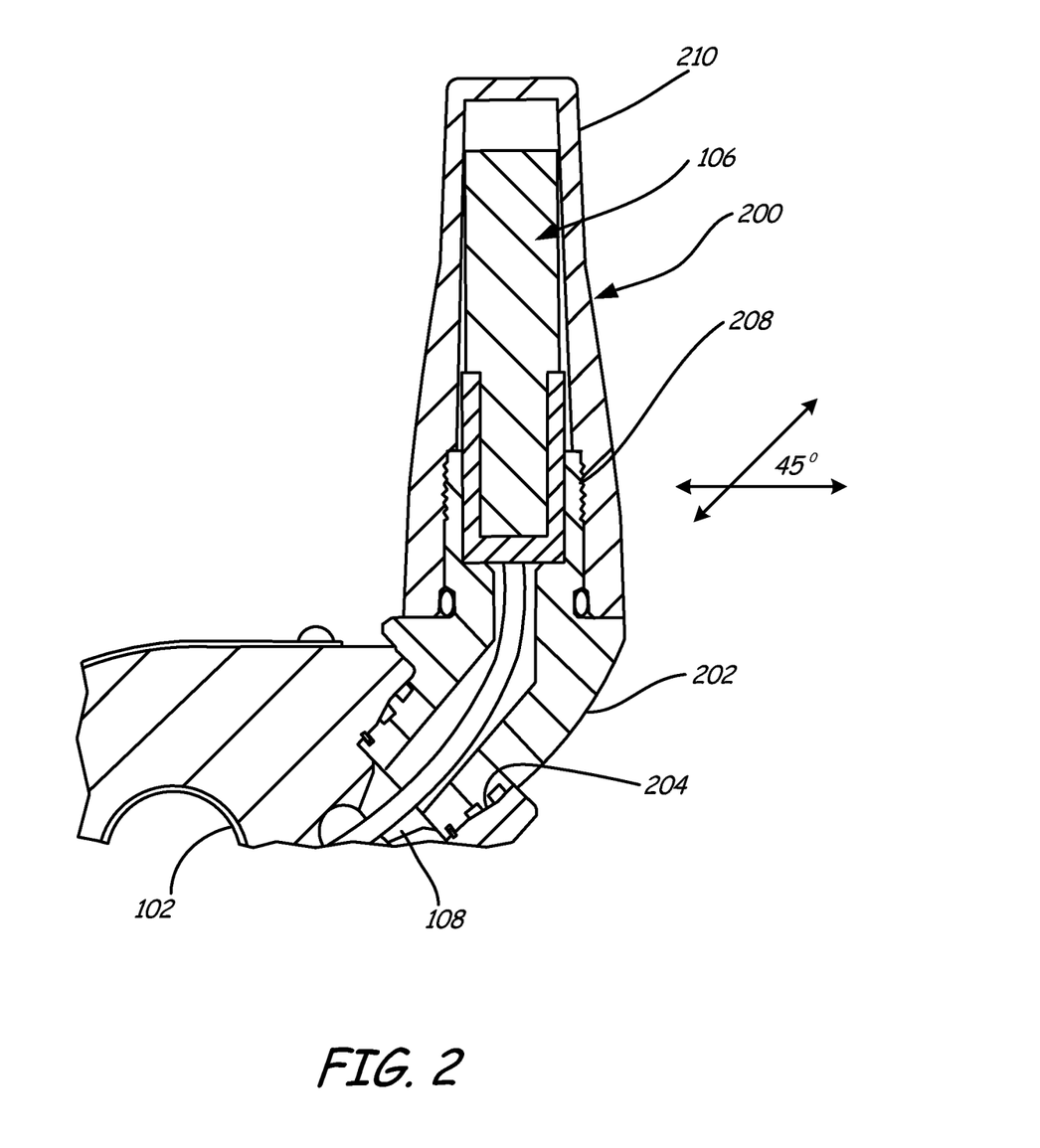
FIG. 2 is a partial cross sectional view of a field device having an antenna assembly in accordance with an embodiment of the present invention.

FIG. 2 is a partial cross sectional view of a field device coupled to an antenna assembly in accordance with an embodiment of the present invention. As shown in FIG. 2, antenna assembly 200 includes antenna base 202 that fits within bore 204 of field device housing 102. As illustrated in FIG. 2, the axis of bore 204 in field device housing 102 is oriented at an angle of approximately 45° to the two desired antenna locations. Antenna mount 202 is pushed into bore 204, which is preferably a tapered hole in housing 102 and retained therein preferably using a metal snap ring. Once base 202 is engaged a suitable distance within bore 204, the snap ring (shown in FIG. 3) springs into a cooperative groove in housing 102 to retain base 204 therein. Preferably, base 204 includes an externally threaded region 208 that accepts a cooperative internally threaded region of radome 210. Preferably, one or more O-rings are interposed between an external diameter of base 202 and bore 204 to provide friction to hold antenna assembly 200 in a desired rotational orientation as well as to provide a water-tight seal. Antenna assembly 200 can be rotated about the axis of bore 204 thereby moving antenna 106 90° between the two orientations while maintaining a constant seal.

Figure 3:
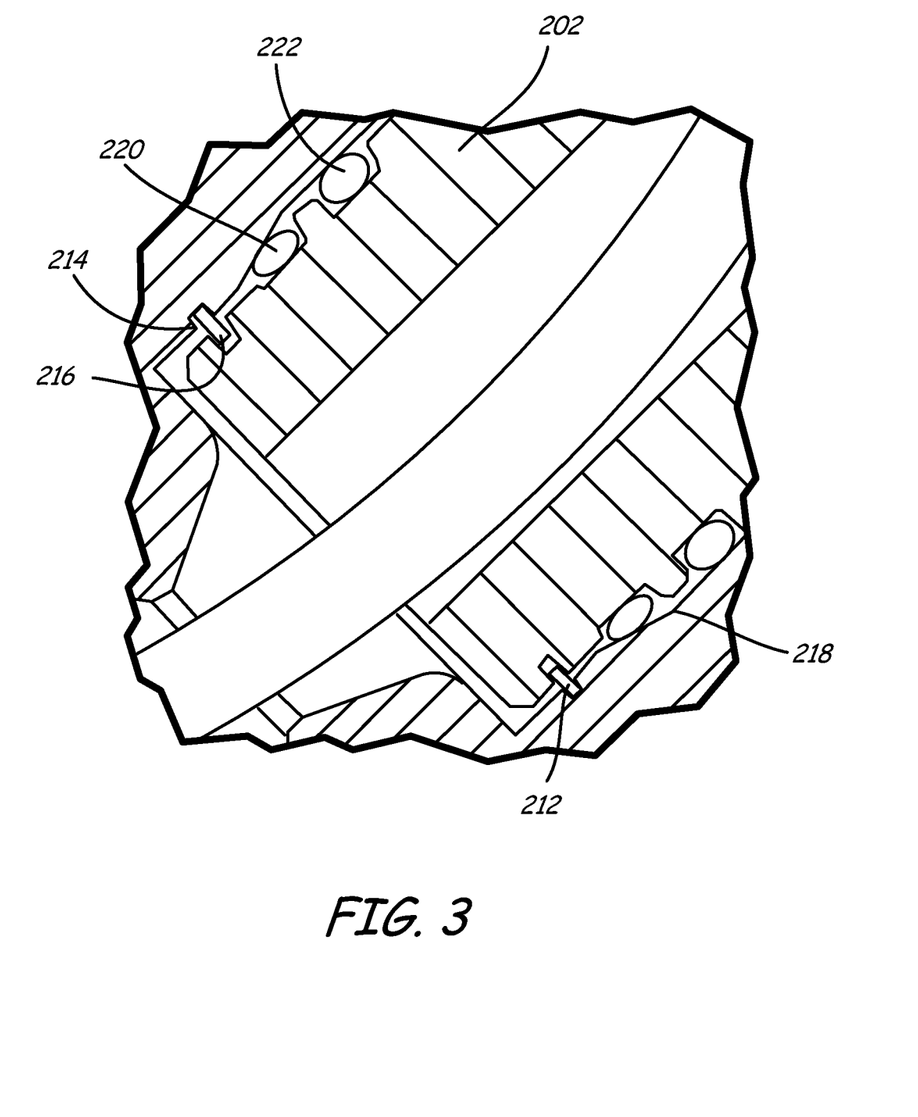
FIG. 3 is an enlarged cross sectional view showing the specific engagement of an antenna mount with a field device antenna receiving bore in accordance with an embodiment of the present invention.

FIG. 3 is an enlarged cross sectional view showing the specific engagement of base 202 with bore 204. As can be seen, metal snap ring 212 has snapped out partially to engage groove 214 within bore 204, while also engaging groove 214 in base 202. Once snap ring 212 has deployed, axial displacement of base 202 relative to bore 204 is substantially fixed. In order to assemble the field device/antenna assembly, base 202 will have snap ring 212 expanded, and slid over the outer diameter of base 202, until ring 212 arrives in groove 214. Groove 216 is sized such that snap ring 212 can be compressed completely within the groove, thereby not extending beyond the external diameter of that portion of base 202. In this condition, base 202 can be slid into bore 204 of housing 102. Once snap ring 212 is sliding within bore 204, it will naturally snap into groove 214 once base 202 reaches the axial position where grooves 214 and 216 align. As can be appreciated, the provision of tapered portion 218 within bore 204 allows for automatic compression of snap ring 212 as base 202 is inserted axially into bore 204. This facilitates assembly in that snap ring 212 need not be compressed to any extent as base 202 is initially inserted into bore 204. Then, as mount 202 reaches taper 218, the walls of taper 218 will compress the outer diameter of snap ring 212 within groove 216.

As can also be seen in FIG. 3, one or more O-rings 220, 222 are preferably provided to seal the interface between bore 204 and antenna base 202 from moisture, or other undesirable materials.

While it is preferred that rotation of the antenna assembly relative to the housing be opposed merely by the friction of O-rings 220, 222 bearing against internal surfaces of bore 204, embodiments of the present invention also include utilization of a mechanical fastener (such as a set screw) or other suitable device to allow the rotational orientation of assembly 200 to be secured. Moreover, utilization of such a fastener can provide for an easy connection of the antenna shield (ground) to the housing provided that the fastener is itself conductive. This can be important in keeping electrical transients from entering the enclosure on the shield of the coaxial cable and damaging the electronics.

Figure 4:
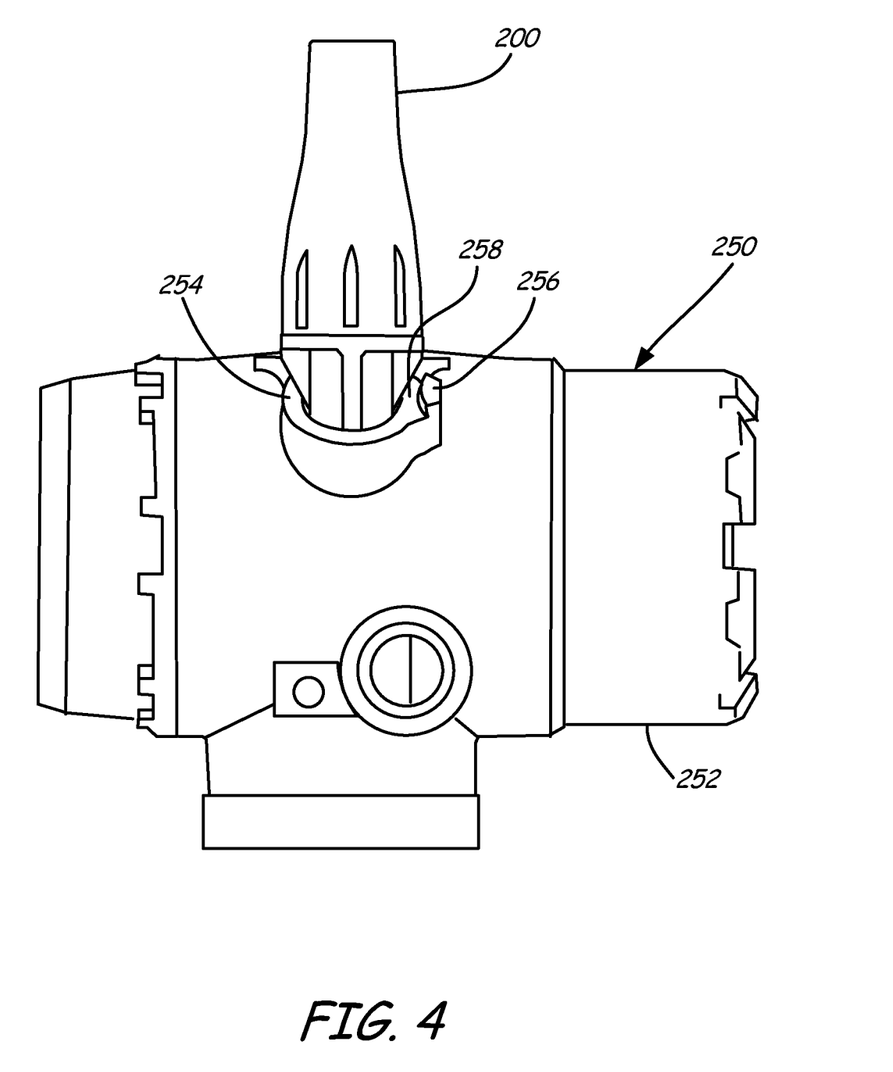
FIG. 4 is a side elevation view of a wireless field device with a rugged, rotation limited wireless communication antenna in accordance with an embodiment of the present invention.
Figure 5:
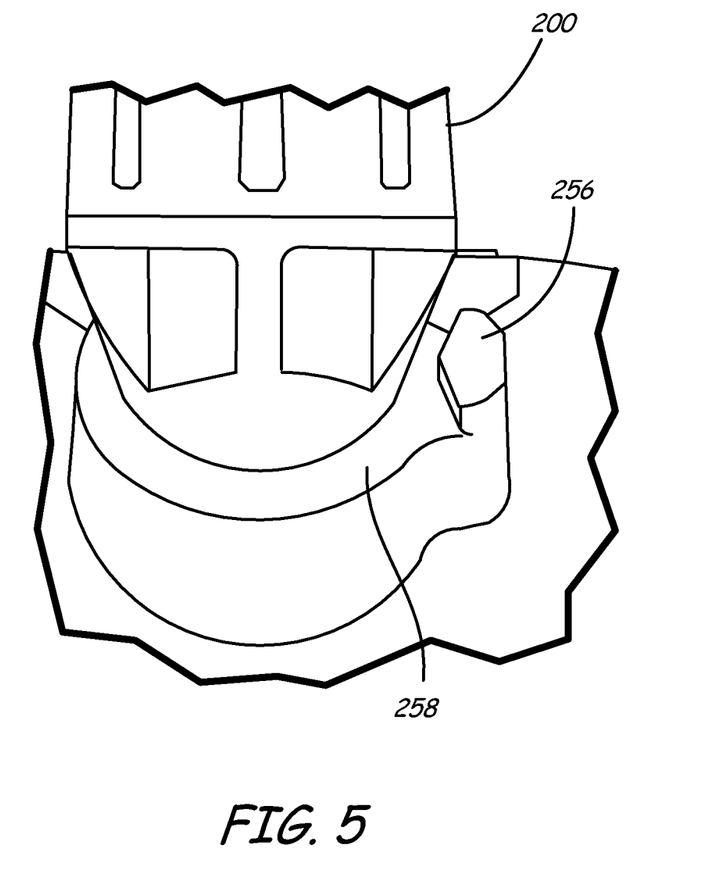
FIG. 5 is an enlarged perspective view of a rotation stop disposed proximate an antenna base in accordance with an embodiment of the present invention.

FIG. 4 is a side elevation view of a field device coupled to an antenna assembly in accordance with an embodiment of the present invention. Field device 250 can be any suitable field device and generally includes housing 252 containing device electronics therein. As further illustrated in FIG. 4, housing 252 includes antenna receiving portion 254 that, as described above, includes a bore therein that has an axis that is at approximately 45° from the two different 90° orientations for assembly 200. FIG. 4 also shows antenna rotation stop 256 in accordance with an embodiment of the present invention. Stop 256 rises up above flat surface 258 of portion 254. A cooperative feature on antenna assembly 200 engages stop 256 to limit rotation of antenna assembly 200 within bore 204 to approximately 300°. FIG. 5 is an enlarged view showing rotation stop 256 rising above flat surface 258 proximate antenna assembly 200.

Figure 6:
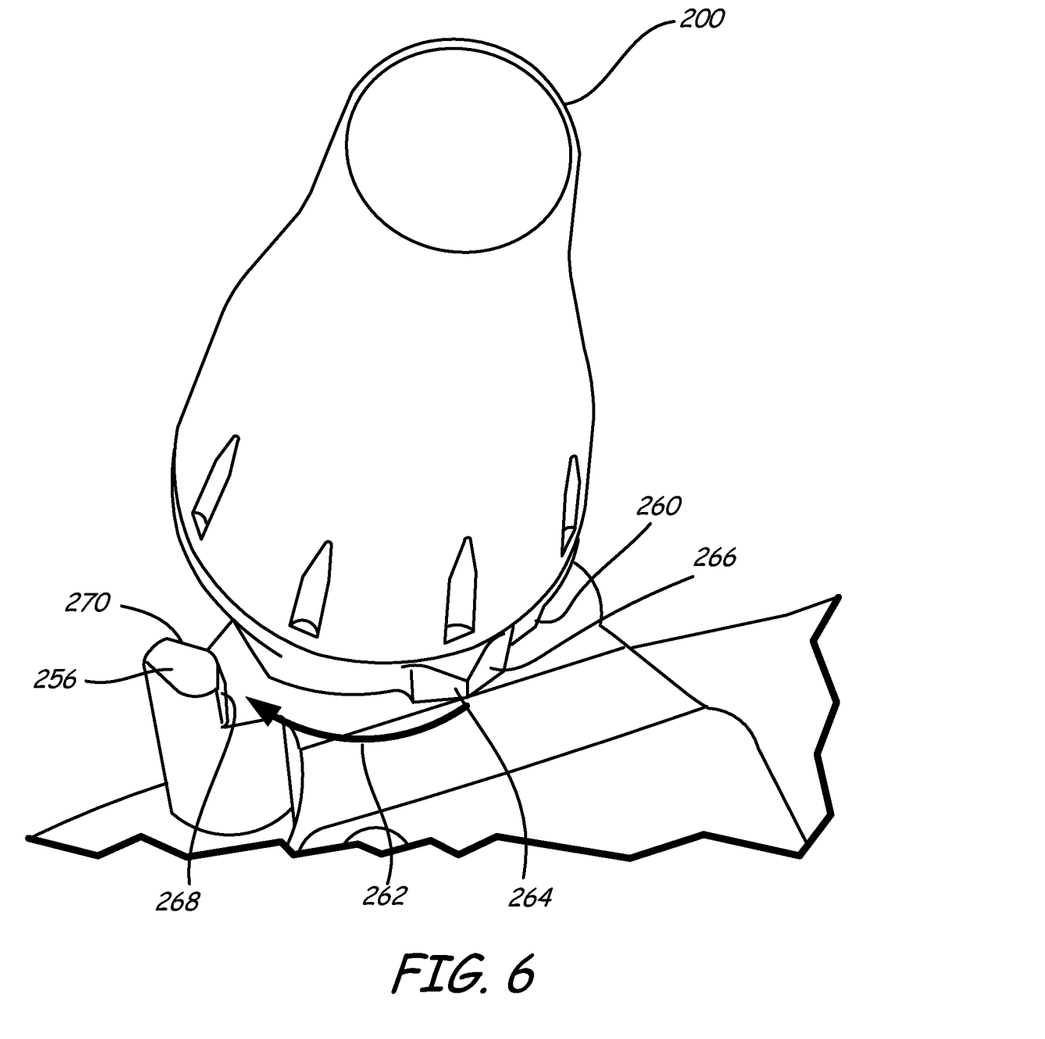
FIG. 6 is a perspective view of rotation of a wireless communication antenna being limited by a rotation stop in accordance with an embodiment of the present invention.

FIG. 6 illustrates cooperative feature 260 of antenna assembly 200 that, as antenna assembly 200 is rotated in the direction indicated by arrow 262, will finally engage against rotation stop 256 to inhibit further rotation of antenna assembly 200. Feature 260 is preferably die-cast, or otherwise formed, as a unitary part of antenna base 202. It is preferred that antenna base 202 and housing 102 be constructed of metal, or a robust plastic. More preferably, antenna base 202 can be constructed, preferably being die-cast, from a metal such as zinc or aluminum. However, other suitable materials can be used in accordance with embodiments of the present invention.

Referring to FIG. 6, feature 260 preferably includes a pair of surfaces 264, 266, that engage with respective surfaces 268, 270 of stop 256. In this way, when portion 260 finally engages stop 256, the engagement will be between two essentially flat surfaces that bear against each other. The utilization of a flat surface making planar contact with rotation stop 256 helps prevent paint damage when the two surfaces repeatedly engage one another. As illustrated in FIG. 6, surface 264, 266 on feature 260 are arranged at an angle relative to one another. Preferably this angle is equal to or less than 90 degrees. However, embodiments of the present invention can be practiced with any suitable structure for feature 260 and stop 256. Specifically, feature 260 could simply be a tab that extends from the outer diameter of base 202, and stop 256 could be a pin or other suitable structure that is pressed into a suitably sized hole within field device housing 102. This would be particularly appropriate in embodiments where antenna base 202 is threaded into bore 204. Thus, once antenna base 202 is threaded to a suitable extent within bore 204, the stop/pin could be pressed into its bore to then limit further rotation of the antenna assembly within bore 204.

Although the present invention has been described with reference to preferred embodiments, workers skilled in the art will recognize that changes may be made in form and detail without departing from the spirit and scope of the invention.

What is claimed is:

1. A field device comprising:
    a housing having at least an antenna receiving bore formed integrally therein;
    field device electronics disposed within the housing, the field device electronics including wireless communication circuitry configured to communicate wireless process information;
    an antenna assembly including an antenna base sealing engaged within the antenna receiving bore of the housing to thereby seal the housing from an environment of the field device, the antenna assembly including an antenna which extends at an angle with respect to the bore and which is operably coupled to the wireless communication circuitry;
    wherein the antenna assembly is rotatable within the bore by an amount less than one full rotation, and wherein rotation of the antenna assembly varies orientation of the antenna; and
    the housing has a rotation stop and the antenna base has a feature, each of the rotation stop and the feature include protrusions, wherein the protrusions of the rotation stop engage the protrusions of the feature to prevent rotation of the antenna assemble beyond a given amount with respect to the housing.

2. The field device of claim 1, and further comprising a radome coupled to the antenna base to seal the antenna therein.

3. The field device of claim 1, wherein at least one of the housing and the antenna base includes a feature that prevents rotation beyond a given amount.

4. The field device of claim 1, wherein the rotation stop includes at least one flat surface disposed to engage the feature of the antenna base.

5. The field device of claim 4, wherein the rotation stop includes a pair of flat surfaces.

6. The field device of claim 5, wherein the pair of flat surfaces are disposed at an angle relative to each other, wherein the angle is greater than ninety degrees.

7. The field device of claim 1, wherein the protrusions of the housing comprises a pin extending from the housing.

8. The field device of claim 1, wherein the antenna receiving bore includes a groove configured to engage a snap ring to retain the antenna base therein.

9. The field device of claim 8, wherein the antenna receiving bore includes a tapered portion configured to compress the snap ring as the antenna base is inserted into the antenna receiving bore.

10. The field device of claim 1, and further comprising at least one elastomeric o-ring interposed between an outer circumference of the antenna base and an inner surface of the antenna receiving bore.

11. The field device of claim 10, wherein the at least one elastomeric o-ring is configured to generate friction to oppose rotation of the antenna base within the antenna receiving bore.

12. The field device of claim 11, wherein the at least one elastomeric o-ring includes a plurality of elastomeric o-rings.

13. The field device of claim 1, wherein the antenna is a trace on a circuit board.

14. The field device of claim 1, wherein the antenna is coupled to the wireless communication circuitry with a coaxial cable.

15. The field device of claim 1, wherein the housing is constructed a material selected from the group consisting of metal and plastic.

16. The field device of claim 15, wherein the antenna base is constructed from metal.

17. The field device of claim 16, wherein the metal is aluminum.

18. The field device of claim 1, wherein rotation is limited to less than approximately 300 degrees.

19. The field device of claim 1, wherein the antenna base threadingly engages the antenna receiving bore.

20. The field device of claim 1, and further comprising a mechanical fastener arranged to selectably inhibit any rotation of the antenna base relative to the housing.

21. The field device of claim 1, wherein the antenna assembly includes an antenna shield that is electrically coupled to the antenna base.

22. The field device of claim 21, wherein the electrical coupling of the antenna shield to the antenna base is through a conductive fastener.

\* \* \* \* \*